United States Patent
Taylor

(10) Patent No.: US 7,407,408 B1
(45) Date of Patent: Aug. 5, 2008

(54) FLEXIBLE CIRCUIT CONNECTOR ASSEMBLY WITH STRAIN RELIEF

(75) Inventor: Paul R. Taylor, Mechanicsburg, PA (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 11/751,070

(22) Filed: May 21, 2007

Related U.S. Application Data

(60) Provisional application No. 60/871,628, filed on Dec. 22, 2006.

(51) Int. Cl.
*H01R 13/58* (2006.01)
*H01R 12/00* (2006.01)
*H01R 12/24* (2006.01)

(52) U.S. Cl. .......................... 439/449; 439/492; 439/67

(58) Field of Classification Search ................. 439/449, 439/451, 452, 455, 457, 458, 459, 492, 493, 439/67
See application file for complete search history.

(56) References Cited

U.S. PATENT DOCUMENTS

| | | | |
|---|---|---|---|
| 5,306,160 A | * | 4/1994 | Roberts ........................ 439/62 |
| 5,801,728 A | | 9/1998 | Yanagi et al. |
| 6,039,600 A | * | 3/2000 | Etters et al. .................. 439/496 |
| 6,150,614 A | | 11/2000 | Miller et al. |
| 6,368,117 B1 | | 4/2002 | Taylor |
| 6,388,883 B1 | | 5/2002 | Serizawa et al. |
| 6,425,691 B1 | | 7/2002 | Demangone |
| 6,464,534 B1 | * | 10/2002 | Schramme et al. .......... 439/492 |
| 6,537,082 B2 | | 3/2003 | Hopfer, III et al. |
| 6,583,990 B2 | | 6/2003 | Serizawa et al. |
| 6,679,713 B2 | * | 1/2004 | Miura ......................... 439/260 |
| 6,821,130 B2 | | 11/2004 | Danley |
| 6,926,537 B1 | | 8/2005 | Auchincloss et al. |
| 2002/0006744 A1 | * | 1/2002 | Tashiro ........................ 439/329 |
| 2006/0068613 A1 | * | 3/2006 | Tsukada et al. ............... 439/67 |
| 2007/0015378 A1 | * | 1/2007 | Huang .......................... 439/67 |
| 2007/0026724 A1 | * | 2/2007 | Mori et al. .................... 439/492 |

* cited by examiner

*Primary Examiner*—Chandrika Prasad
(74) *Attorney, Agent, or Firm*—Hooker & Habib, P.C.

(57) ABSTRACT

An electrical connector assembly has a flexible circuit with a central portion that carries a contact field. Slots extending towards the central portion define a pair of strain arms that attach the flexible circuit to a clamp member. Forces transmitted to the strain arms are not communicated to the central portion of the flexible circuit.

27 Claims, 3 Drawing Sheets

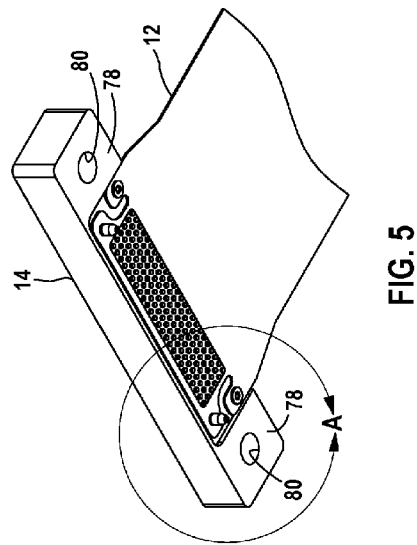
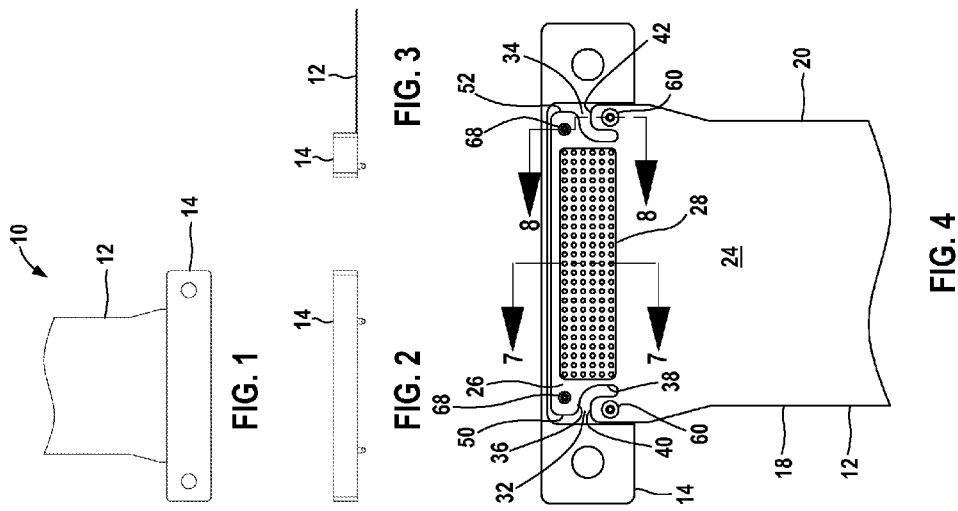

FLEXIBLE CIRCUIT CONNECTOR ASSEMBLY WITH STRAIN RELIEF

This application claims priority to my provisional patent application filed on Dec. 22, 2006 and having Application No. 60/871,628.

FIELD OF THE INVENTION

The invention relates to an electrical circuit connector having a flexible circuit and used to form electrical connections between closely spaced contacts of the flexible circuit and closely spaced contacts of a printed circuit board.

BACKGROUND OF THE INVENTION

Electrical connectors are used to form electrical connections between circuit boards that each contains a high density of electrical contacts. The contacts are arranged in a series of rows and columns in a contact field that covers a central portion of the flexible circuit. The contacts are closely spaced and a large number of contacts are included in a relatively small area.

One type of electrical connector used to interconnect circuit boards includes a flexible circuit having contacts located on one side of the flexible circuit. The flexible circuit is mounted on a backing member or support member on the opposite side of the flexible circuit across from the contacts. The support member carries a spring that faces the flexible circuit.

The support member is clamped against the printed circuit board with the contacts of the flexible circuit overlaying corresponding contacts of the printed circuit board. The spring is compressed between the support member and printed circuit board, the spring generating a spring force pressing the contacts of the flexible circuit against the contacts of the circuit board.

The flexible circuit is attached to the support member with some ability to "float", that is, to move towards or away from the support member so that the portion of the flexible circuit carrying the contacts can remain against the spring when the spring is compressed. If the flexible circuit is not free to move with the spring, the spring may not compress properly and sufficient spring force may not be applied to all the contacts. Some of the contacts may not be pressed with enough force to form adequate electrical connections.

Conventionally, the flexible circuit is attached to the support member by a pair of rivets. The rivets are located on either side of the contact field and extend through rivet holes in the flexible circuit. The rivets may be designed to allow some float between the rivets and the flexible circuit.

Alignment pins also extend from the support member through the flexible circuit. The alignment holes are received in corresponding holes in the circuit board. The alignment pins and holes finely align the support member and the circuit board during assembly so that the contacts of the flexible circuit overlay the corresponding contacts of the circuit board.

Users may pull or tug on the flexible circuit to align the support member with the printed circuit board. The pulling or tugging force is transmitted from the flexible circuit to the rivets. The pulling or tugging force may cause tears in the flexible circuit at the rivet holes, particularly if the flexible circuit has low amounts of metal at the rivet holes.

Furthermore, the pulling or tugging force may press the flexible circuit against the rivets. The flexible circuit binds against the rivets, preventing the flexible circuit from freely moving with the spring. As a result, electrical connections between some pairs of electrical contacts may not be made or may be inadequately made.

Thus there is a need for an electrical connector having a flexible circuit that can better withstand pulls and tugs on the flexible circuit without tearing while allowing the flexible circuit to freely move with the spring during and after assembly.

SUMMARY OF THE INVENTION

The invention is an improved electrical connector having a flexible circuit that can better withstand pulls on the flexible circuit without tearing while allowing the flexible circuit to freely move with the spring during and after assembly.

An electrical connector in accordance with the present invention assembly includes a flexible circuit assembly that includes a flexible circuit, a support member on an end of the flexible circuit, and a spring between the support member and the end of the flexible circuit. The flexible circuit has a back side facing the support member and an opposite front side. A central contact field is on the front side of the flexible circuit having a number of contacts for electrically interconnecting the flexible circuit to another contact field of a printed circuit board or other base member. The end of the flexible circuit includes a pair of strain relief arms, each arm on a respective edge of the flexible circuit. Each relief arm is attached to the support member by a connecting member. A gap or slot is between each strain arm and the contact field to resist transmission of loads applied to the connection members to the contact field.

The gaps or slots isolate the contact field from the strain arms. If the flexible circuit is pulled or tugged during assembly, the flexible circuit may bind against the connecting members. However, the portion of the flexible circuit carrying the contact field remains free to move with the spring when the spring is compressed between the support member and the base member during assembly. Reliable electrical interconnections are made between the contacts of the flexible circuit and the contacts of the base member even if the flexible circuit is tugged or pulled during assembly.

In a preferred embodiment of the invention the end of the flexible circuit has two tabs, each tab between the contact field and an edge of the flexible circuit. Alignment pins extend from the support member and through the tabs. The gaps or slots separate and isolate the strain arms from the alignment pins.

Flexible circuits are formed from layers of copper separated by flexible polyimide or polyester substrates. Electrical circuits are built using a "subtractive" technique in which copper is removed by etching, and an "additive" technique in which layers of copper are added. Copper may be removed from the flexible circuit in those portions not used as circuitry, or copper may be added as a "pattern-plate" at strategic areas of the flexible circuit.

In preferred embodiments of the flexible circuit assembly, the copper in the strain arms and leading away from the strain arms along the edges of the flexible circuit is not etched away. Preferably additional pattern-plate is used to increase the copper thickness along the strain arms. The copper forms a pair of elongate force transmitting members, each member extending along a strain arm on one edge of the flexible circuit. The copper helps resist transmittal of forces to the connection members when the flexible circuit is pulled or tugged during assembly. In alternative embodiments other force transmitting members, preferably metallic, may be used.

Other objects and features of the invention will become apparent as the description proceeds, especially when taken in conjunction with the accompanying drawings illustrating the invention.

BRIEF SUMMARY OF THE DRAWINGS

FIGS. 1, 2, and 3 are top, front, and side views respectively of a flexible circuit assembly of an electrical connector in accordance with the present invention;

FIG. 4 is a bottom view of the flexible circuit assembly;

FIG. 5 is a bottom perspective view of the flexible assembly;

DESCRIPTION OF THE PREFERRED EMBODIMENT

Figure 6:
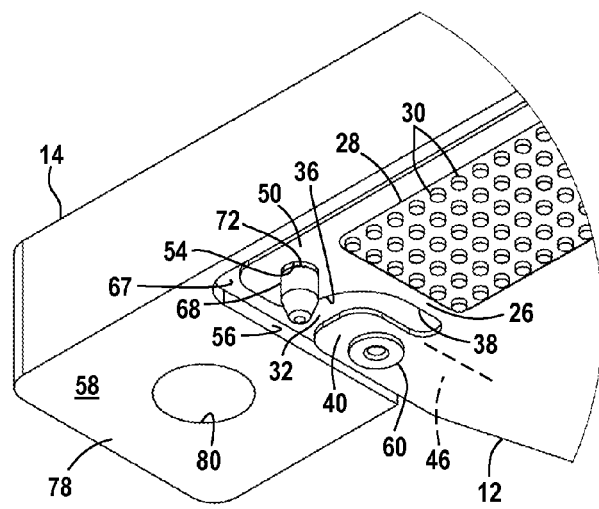
FIG. 6 is an enlarged view of the portion circled as "A" in FIG. 5.
Figure 7:
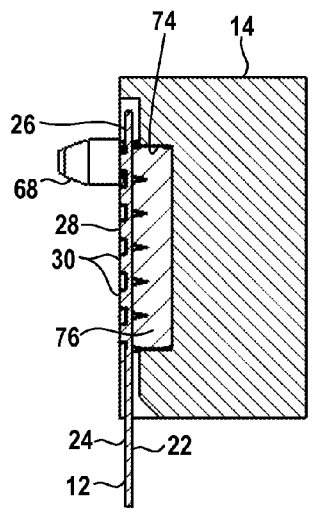
FIG. 7 is a sectional view taken along lines 7-7 of FIG. 4.
Figure 8:
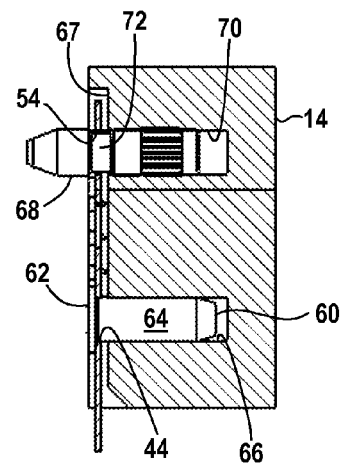
FIG. 8 is a sectional view taken along lines 8-8 of FIG. 4.

FIGS. 1-8 illustrate a flexible circuit assembly 10 in accordance with the present invention. Flexible circuit assembly 10 forms part of an electrical connector 110 that electrically interconnects flexible circuit 12 with a printed circuit board 112 (see FIGS. 9 and 10).

Flexible circuit assembly 10 includes an elongate flexible circuit 12 and a backing member or support member 14 attached to an end portion 16 of the flexible circuit. Flexible circuit 12 has a number of copper conductors (not illustrated) that extend longitudinally along the circuit between laterally-spaced edges 18, 20

The end portion 16 of the flexible circuit is generally flat and includes a rear side 22 facing the support member 14 and an opposite front side 24. A central circuit portion 26 carries a contact field 28 on the second side of the flexible circuit 12 between circuit edges 18, 20 for interconnecting the flexible circuit 12 with another contact field. Contact field 28 has a number of individual electrical contacts 30 arranged in rows and columns.

A pair of slots or openings 32, 34 is spaced from the end of the flexible circuit. Each slot 32, 34 extends inwardly from respective circuit edge 18 or 20 towards central portion 26. Slots 32, 34 are substantially "L" shaped, with each slot having an inwardly extending slot portion 36 and a longitudinal slot portion 38. Longitudinal slot portion 38 is spaced from the edge of the flexible circuit and extends towards the other end of the flexible circuit.

Slots 32, 34 define a pair of similar strain relief arms 40, 42 adjacent respective edges 18, 20. Each arm 40, 42 is located between the edge 18 or 20 and the central circuit portion 26. Each arm 40, 42 includes a through hole or opening 44 for attaching the flexible circuit to the support member 14.

Extending from the strain relief arm 40, 42 are elongate reinforcing members 46, 48. Reinforcing member 46 is adjacent circuit edge 18 and reinforcing member 48 is adjacent edge 20. The reinforcing members 46, 48 are preferably formed from metal; the illustrated members 46, 48 are copper members formed from unetched portions of the flexible circuit conductors.

Slots 32, 34 also define a pair of like tabs 50, 52 extending laterally from each edge 18 or 20 towards center circuit portion 26. Each tab 50, 52 includes a relatively small-diameter alignment hole or opening 54 to receive an alignment pin (described below) for accurately positioning the support member 14 on the circuit board 112.

Flexible circuit end portion 16 is received in a recess 56 formed in the front side 58 of support member 14 facing the flexible circuit. A pair of like connection members 60 attaches circuit portion to support member 14. The connection members 60 pass through the holes 48 of the strain relief arms to secure each strain relief arm 40 to support member 14. Slots 32, 34 each extends at least ninety degrees in angular extent around the adjoining connection member 60 to separate the connection members 60 in both lateral and longitudinal directions from the central flexible circuit portion 26.

Each connection member 60 is a pin having a radially-enlarged head 62 and a split shank 64 that extends into a blind bore 66 in support member 14. The sidewalls of bore 66 compress shank 64 and generate a friction fit between the shank 64 and support member 14, retaining the pin in the bore. In other embodiments connection members 60 can be formed as rivets having axially opposed heads that mechanically connect the strain arms 40 with support member 14. Head 62 is spaced above the recess floor 67 to permit some movement of the shank arm 40 between head 62 and support member 14. In alternative embodiments, heads 62 can clamp or compress strain arms 40 directly against the recess floor 67.

Alignment pins 68 extend from bores 70 formed in support member 14 through alignment holes 54 of flexible circuit 12. Friction between the bore sidewalls and the alignment pins retain the pins with the support member 14. Each alignment pin 68 includes an undercut shank portion 72 where the pin extends through the flexible circuit, permitting movement of the flexible circuit central portion 26 towards and away support member floor 67.

Support member 14 is a rigid member formed from metal or plastic. Support member 14 includes a recess or spring compartment 74 that extends inwardly from floor 67. Spring compartment 74 is behind contact field 28 when the flexible circuit 12 is attached to support member 14. A spring formed as a compression mat or elastomeric pressure pad 76 is housed within the compartment. My co-pending U.S. patent application Ser. No. 11/751,075 titled "Compression Mat for an Electrical Connector", incorporated by reference as if fully set forth herein, discloses an elastomeric mat or pressure pad that may be used in preferred embodiments of the present invention. Other types and designs of spring or pressure pads 76 are known and can be adapted for use with the present invention. Pressure pad 76 extends slightly above the compartment towards contact field 28 when the pad is unstressed.

In the illustrated embodiment, support member 14 has mounting portions 78 that extend outwardly from the flexible circuit 12 and mounts the support member 14 against the printed circuit board 112. Each mounting portion includes a through-fastener hole 80.

Figure 9:
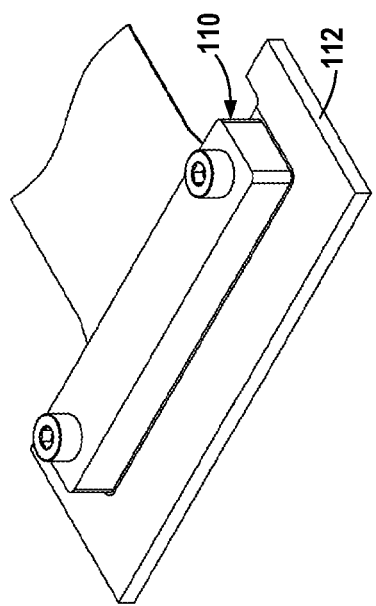
FIG. 9 is a perspective view of the electrical connector attached to a circuit board.
Figure 10:
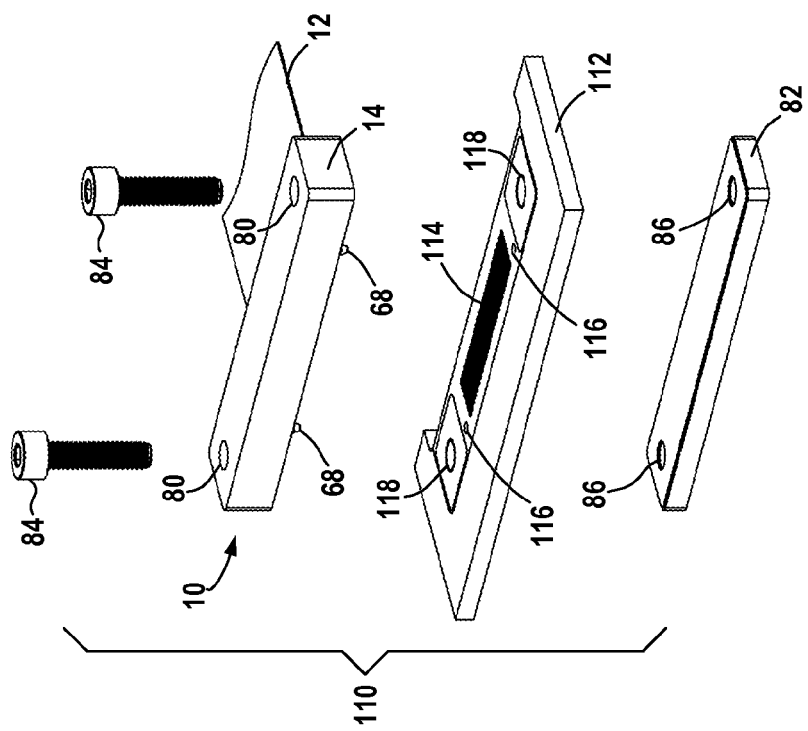
FIG. 10 is an exploded view of FIG. 9.

FIG. 9 illustrates the other components of compression connector 110 prior to assembly on circuit board 112. These include backing plate 82 and threaded fasteners 84. Backing plate 82 has a pair of threaded holes 86.

In use, flexible circuit assembly 10 is placed above the circuit board 112, with contact field 28 of flexible circuit 12 over and generally aligned with contact field 114 of the circuit board 112. Backing plate 82 is placed on the other side of the circuit board 112, with threaded holes 86 aligned with fastener holes 80.

During initial handling and alignment of the flexible circuit assembly 10 over circuit board 112, users may pull or tug on flexible circuit 12. Connecting members 60 and strain arms 40 cooperate to resist pulling or tugging of the flexible circuit away from the support member 14. The strain arms 40 are separated from the central portion 26 of the flexible circuit 12 by slots 32, 34 so that forces applied to strain arms 40 are not transferred to the flexible circuit contact field 28.

Support member 14 is moved towards circuit board 112 to place the support member against the circuit board. Alignment pins 68 are received in alignment holes 116 in the circuit board for fine alignment of flexible circuit contact field 28 over circuit board contact field 114, with flexible circuit contacts 30 overlying corresponding electrical contacts of circuit board contact field 114.

Fasteners 84 are then inserted through support member fastener holes 80 and fastener holes 118 in the circuit board 112, and are threaded into threaded holes 86. Tightening the fasteners 84 clamps the circuit board 112 between support member 14 and backing plate 82. This presses support member 14 against the circuit board 114 and compresses pressure pad 76 in spring compartment 74 between the support member 14 and the circuit board 112. The pressure pad 76 generates a spring force urging the central portion 26 of the flexible circuit 12 against the printed circuit board 112. FIG. 9 illustrates connector 110 attached to circuit board 112.

As circuit member 112 is clamped between support member 14 and backing plate 82, slots 32, 34 in the flexible circuit 12 isolate central portion 26 from tugging or pulling forces being applied to strain arms 40 as previously described. This ensures that the entire contact field 28 freely "floats" or moves in response to deflection of pressure pad 76 during clamping, without binding or mechanical resistance caused by the attachment of the flexible circuit 12 to the support member 14. Slots 32, 34 also isolate alignment pins 68 from the strain arms 40 so that the flexible circuit central portion 28 can also float or move along the undercuts of alignment pins 68 without binding. The contact field 28 freely moves with compression of pressure pad 76, allowing pressure pad 76 to reliably apply a spring force to each contact 30 that electrically interconnects the contact with the corresponding contact of the circuit board.

Other electrical connectors having different clamping structures that clamp flexible circuit assembly 10 to circuit board 112 for forming electrical interconnections between contact fields are known and can be readily adapted for use with the present invention.

My co-pending U.S. patent application Ser. Nos. 11/751,068 and 11/751,078, each titled "Flexible Circuit Connector Assembly", each incorporated by reference as if fully set forth herein, disclose another electrical connector that incorporates the flexible circuit assembly of the present invention.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention is:

1. A connector assembly comprising:
   a base including a plurality of base contacts;
   a support member over the base, the support member including a recess facing the base and a pair of alignment pins;
   a spring in the recess;
   an elongate flexible circuit between the base and the support member, the flexible circuit including a central portion, a plurality of circuit contacts on the central portion overlying the base contacts with the circuit contacts located to be held against the base contacts by the spring and form electrical connections therewith, two arms, each arm between the central portion and one flexible circuit edge, two tabs, each tab between the central portion and one flexible circuit edge, two elongate force transmitting members, each force transmitting member extending along one arm and one edge of the flexible circuit, an alignment opening in each tab, each alignment pin of the support member extending through one alignment opening, two connection members, each connection member securing one arm to the support member, wherein a force applied to the flexible circuit away from the central portion is communicated through the force transmitting members to the support member and is not communicated to the central portion.

2. The connector assembly as in claim 1 wherein said alignment pins are undercut adjacent the flexible circuit.

3. The connector assembly as in claim 1 including a slot between each arm and the central portion of the flexible circuit.

4. The connector assembly as in claim 3 wherein each slot extends between one arm and the adjacent tab.

5. The connector assembly as in claim 4 wherein each slot includes a first portion extending inwardly from the adjacent edge of the flexible circuit and a second portion extending in a direction along the flexible circuit.

6. The connector assembly as in claim 5 wherein each slot is generally L-shaped.

7. The connector assembly as in claim 1 wherein the central portion is located at an end of the flexible circuit, and each tab is located between the end of the flexible circuit and an arm.

8. The connector assembly as in claim 1 wherein each tab extends to an edge of the flexible circuit.

9. The connector assembly as in claim 1 wherein each connection member extends through an opening in an arm and into an opening in the support member.

10. The connector assembly as in claim 9 wherein one connection member comprises a rivet.

11. The connector assembly as in claim 9 wherein one connection member comprises a threaded fastener.

12. The connector assembly as in claim 9 wherein one connection member comprises a clamp.

13. The connector assembly as in claim 1 wherein each force transmitting member comprises a metal strip.

14. The connector assembly as in claim 1 wherein each force transmitting member is made of metal.

15. The connector assembly as in claim 14 wherein the metal is copper.

16. A connector assembly including a base including a plurality of base contacts; and a flexible circuit comprising an elongate flat body having opposed edges, a plurality of conductors extending along the body, a central portion at one end of the body, a plurality of circuit contacts on the central portion and joined to the conductors, the circuit contacts in overlying engagement with the base contacts to form electrical connections therewith, a pair of stress relief arms at the end of the body, each stress relief arm located between the central portion and an adjacent body edge, a pair of elongate metal force transmitting members in the body, each such member extending along an arm and along the length of the body adjacent one edge thereof, an aperture through each arm and the force transmitting member in the arm, a pair of tabs, each tab joined to the central portion and extending toward an adjacent edge of the body, mounting openings extending through the tabs for locating the central portion on a support member, and a pair of slots in the body, each slot including a first slot portion extending from an edge of the body toward the central portion between an arm and a tab and a second portion extending from the first portion generally away from the end of the body between the arm and the central portion to separate the adjacent arm and force transmitting member from the central portion and tab, wherein a force applied to the body away from the central portion is communicated through the force transmitting members to the arms and is not communicated to the central portion of the flexible circuit.

17. The connector assembly as in claim 16 wherein the force transmitting members are thicker than the conductors.

18. The connector assembly as in claim 16 wherein each slot is generally L-shaped.

19. The connector assembly as in claim 16 including a support member overlying the end of the central portion of the body, the support member including alignment pins extending through said mounting openings; and two fastening members, each fastening member securing a transmitting member in an arm to the support member.

20. The connector assembly as in claim 19 wherein each fastening member comprises a clamp member or rivet.

21. A flexible circuit assembly comprising:
an elongate flexible circuit, a backing member on an end portion of the flexible circuit, and a spring between the backing member and the flexible circuit;
the end portion of the flexible circuit comprising a back side facing the backing member, an opposite front side, and opposed edges;
the front side comprising a central contact field between the edges and a plurality of contacts on the contact field for electrically interconnecting the flexible circuit to another contact field; and
the end portion of the flexible circuit further comprising a pair of strain relief arms, each arm along a respective edge, a pair of connecting members, each connecting member attaching a respective strain relief arm to the backing member, and a gap between each arm and the contact field to resist transmission of loads applied to the connecting members to the contact field.

22. The flexible circuit assembly of claim 21 wherein each connection member extends through one strain relief arm.

23. The flexible circuit assembly of claim 21 wherein the end portion of the flexible circuit comprises a pair of alignment openings and the backing member comprises a pair of alignment pins, each alignment pin extending through one alignment opening, each gap extending between a respective arm and a respective alignment opening.

24. The flexible circuit assembly of claim 21 wherein the spring is an elastomeric mat.

25. The flexible circuit assembly of claim 24 comprising at least one alignment pin and at least one alignment hole, each alignment hole formed in the end portion of the flexible circuit, each alignment pin extending from the backing member through a respective one alignment hole, each alignment pin undercut where the pin extends through the alignment hole.

26. The flexible circuit assembly of claim 21 wherein the flexible circuit comprises a pair of metal reinforcing members, each reinforcing member extending from a respective stress relief arm.

27. The flexible circuit assembly of claim 21 wherein each gap extends at least ninety degrees around a connection member.

\* \* \* \* \*